(12) United States Patent
Barrot et al.

(10) Patent No.: US 9,770,771 B2
(45) Date of Patent: Sep. 26, 2017

(54) METHOD FOR FREEING A MICROMECHANICAL PART AND A MICROMECHANICAL PART COMPRISING SACRIFICIAL FASTENERS

(71) Applicants: Francois Barrot, Erlach (CH); Remy Fournier, Villers-le-Lac (FR); Laurent Giriens, Lausanne (CH); Simon Henein, Neuchatel (CH); Sylvain Jeanneret, Colombier (CH); Johan Kruis, Neuchatel (CH)

(72) Inventors: Francois Barrot, Erlach (CH); Remy Fournier, Villers-le-Lac (FR); Laurent Giriens, Lausanne (CH); Simon Henein, Neuchatel (CH); Sylvain Jeanneret, Colombier (CH); Johan Kruis, Neuchatel (CH)

(73) Assignee: CSEM CENTRE SUISSE D'ELECTRONIQUE ET DE MICROTECHNIQUE SA-RECHERCHE ET DEVELOPPEMENT, Neuchatel (CH)

( * ) Notice: Subject to any disclaimer, the term of this patent is extended or adjusted under 35 U.S.C. 154(b) by 471 days.

(21) Appl. No.: 14/366,919

(22) PCT Filed: Dec. 21, 2012

(86) PCT No.: PCT/EP2012/076860
§ 371 (c)(1),
(2) Date: Jun. 19, 2014

(87) PCT Pub. No.: WO2013/093108
PCT Pub. Date: Jun. 27, 2013

(65) Prior Publication Data
US 2014/0363217 A1    Dec. 11, 2014

(30) Foreign Application Priority Data

Dec. 22, 2011    (CH) .................................... 2033/11

(51) Int. Cl.
*B23D 31/00*    (2006.01)
*B81B 3/00*    (2006.01)
(Continued)

(52) U.S. Cl.
CPC .............. *B23D 31/002* (2013.01); *B32B 7/06* (2013.01); *B81B 3/0051* (2013.01);
(Continued)

(58) Field of Classification Search
CPC ...... B23D 31/002; B23D 7/06; B81B 3/0051; B81C 99/008; B81C 1/00873;
(Continued)

(56) References Cited

U.S. PATENT DOCUMENTS 4,400,861 A * 8/1983 Parker .................... B21D 28/06
148/518
5,882,532 A * 3/1999 Field ..................... B81C 99/008
216/2
(Continued)

FOREIGN PATENT DOCUMENTS

CH         699 110         1/2010
CH    EP 2189854 A1 *    5/2010    ........... G04B 13/026

OTHER PUBLICATIONS

International Search Report dated May 15, 2013 in corresponding PCT application.

*Primary Examiner* — James Ference
(74) *Attorney, Agent, or Firm* — Young & Thompson

(57) ABSTRACT

A method for fabricating a micromechanical part from a substrate in which the part is fabricated by providing a plurality of fasteners between the part and the substrate, the
(Continued)

fasteners being sacrificial, characterized in that the fasteners include at least one hinge at the end of each fastener located beside the part, and in that the method includes a step of breaking the sacrificial fasteners. The micromechanical parts employing this type of sacrificial fastener are also described.

13 Claims, 20 Drawing Sheets

(51) Int. Cl.
  *B81C 99/00* (2010.01)
  *B32B 7/06* (2006.01)
  *E05D 1/02* (2006.01)
(52) U.S. Cl.
  CPC .............. *B81C 99/008* (2013.01); *E05D 1/02* (2013.01); *Y10T 29/4979* (2015.01); *Y10T 403/11* (2015.01)
(58) Field of Classification Search
  CPC ....... B81C 3/002; E05D 1/02; Y10T 29/4979; Y10T 403/11; B32B 7/06; G04B 13/026; G04B 19/042
  See application file for complete search history.

(56) References Cited

U.S. PATENT DOCUMENTS

| | | | |
|---|---|---|---|
| 6,056,887 A * | 5/2000 | Niedermann | B82Y 15/00 216/11 |
| 6,171,972 B1 * | 1/2001 | Mehregany | B05B 1/3436 216/2 |
| 6,780,767 B2 * | 8/2004 | Lutter | B81C 1/00888 257/415 |
| 7,398,588 B2 * | 7/2008 | Stoll | G01M 17/0072 29/595 |
| 7,735,216 B2 * | 6/2010 | Schnabel | B81C 3/002 29/740 |
| 2004/0029481 A1 * | 2/2004 | Gross | B81C 3/002 445/23 |
| 2004/0081802 A1 * | 4/2004 | Pannek | B81C 1/00595 428/172 |
| 2006/0196845 A1 * | 9/2006 | LaFond | C30B 29/16 216/41 |
| 2008/0116533 A1 * | 5/2008 | Chand | B81C 1/00873 257/415 |
| 2008/0198702 A1 * | 8/2008 | Meister | B81C 99/008 368/232 |
| 2009/0113687 A1 * | 5/2009 | Akinwande | B81C 3/002 29/270 |
| 2010/0054089 A1 * | 3/2010 | Maier | B81C 99/0085 368/169 |
| 2010/0054092 A1 * | 3/2010 | Marmy | B81C 99/0095 368/324 |
| 2010/0251549 A1 * | 10/2010 | Tamai | B21D 53/28 29/893 |
| 2010/0306993 A1 * | 12/2010 | Mayyas | B81C 1/00873 29/592.1 |
| 2011/0225801 A1 * | 9/2011 | Fussinger | G04B 13/026 29/525.01 |
| 2014/0363217 A1 * | 12/2014 | Barrot | B81B 3/0051 403/2 |

* cited by examiner

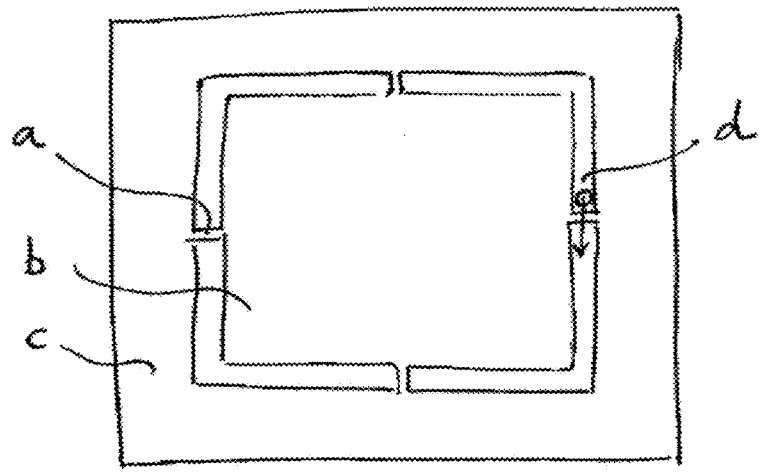
Fig. 0 - Prior Art
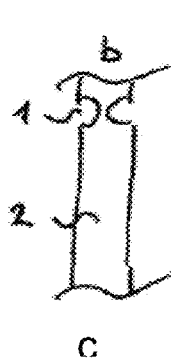 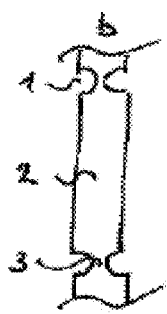   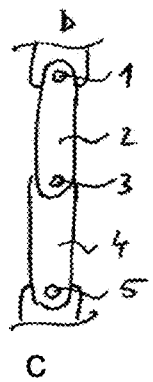
Fig. 1　　Fig. 2　　Fig. 3　　Fig. 4　　Fig. 5
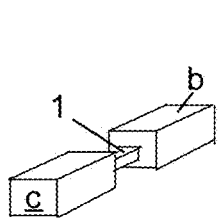 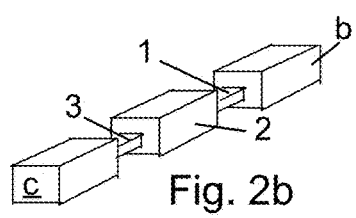 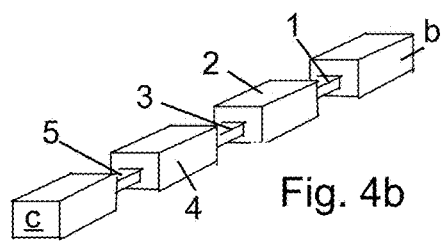
Fig. 1b　　Fig. 2b　　Fig. 4b

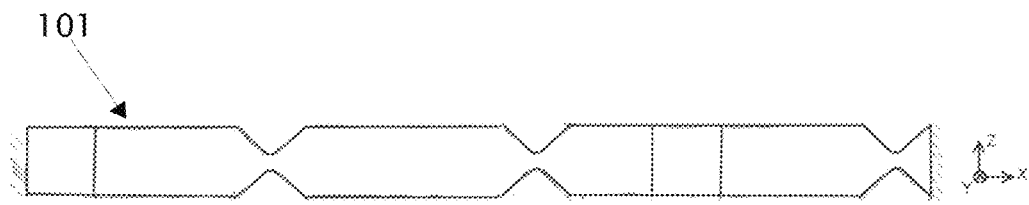
Fig. 10a₁
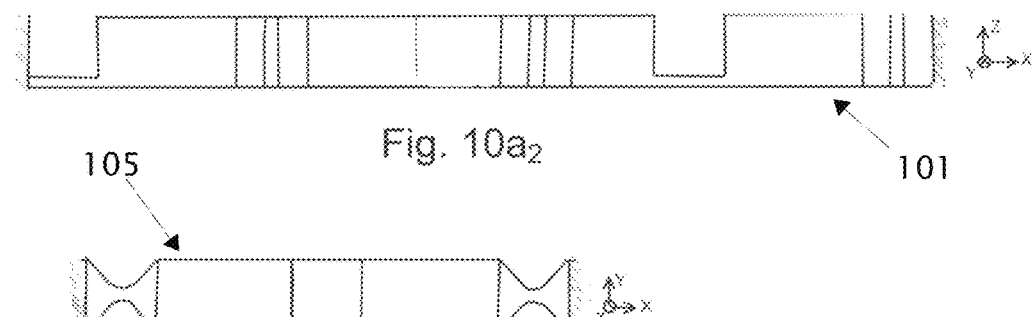
Fig. 10a₂
Fig. 10b₁
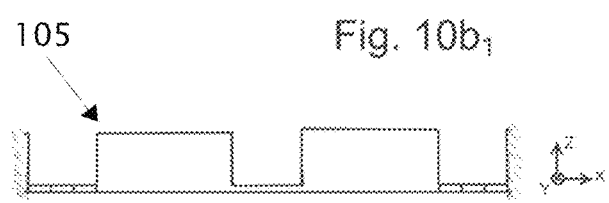
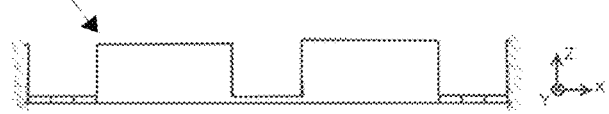
Fig. 10b₂

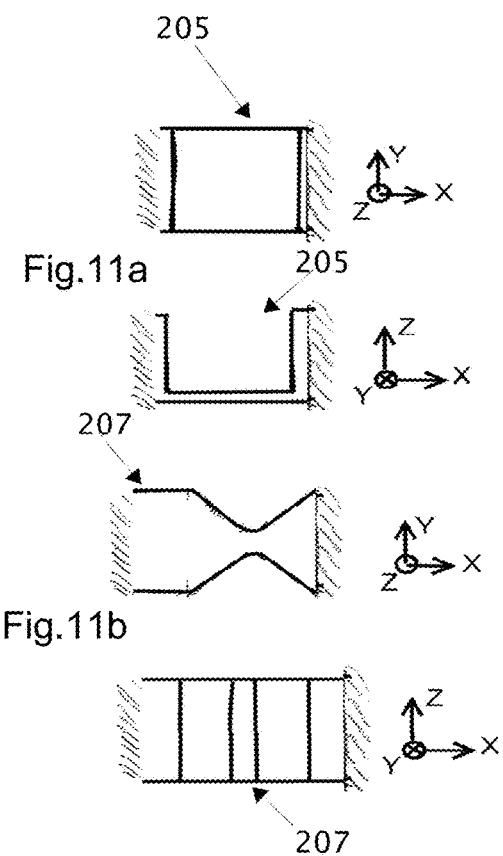

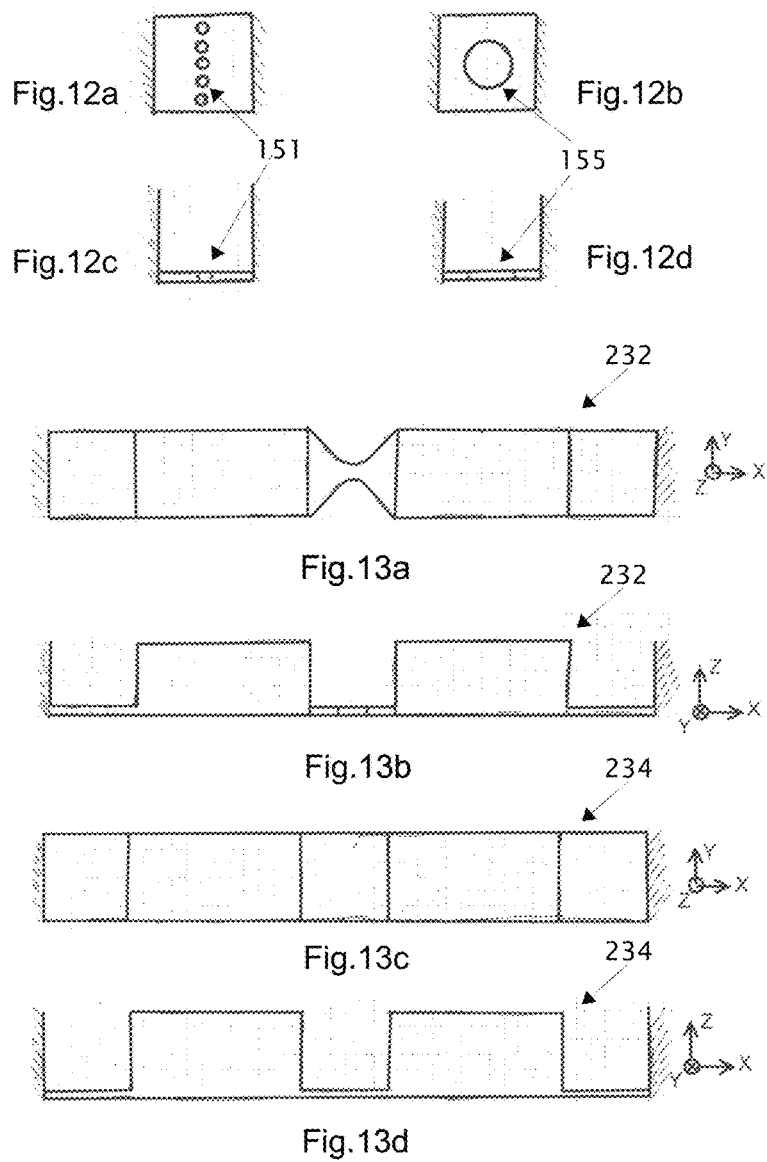

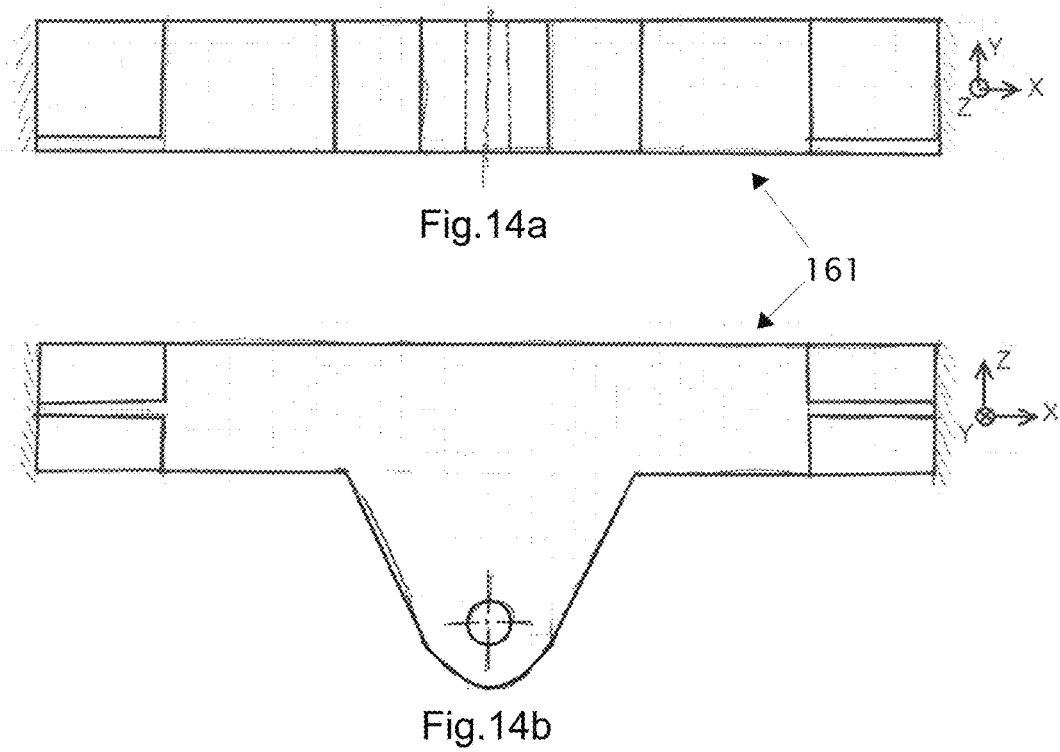
Fig.14a
161
Fig.14b
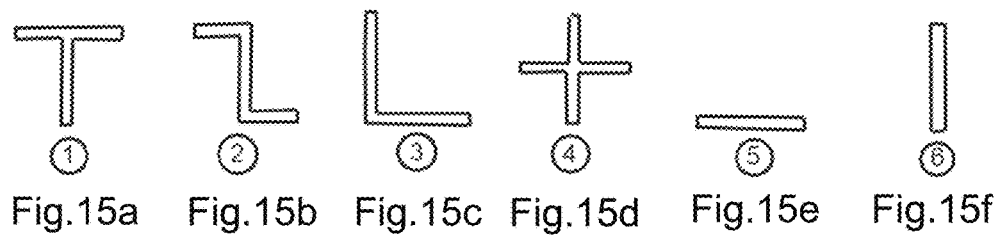
Fig.15a  Fig.15b  Fig.15c  Fig.15d  Fig.15e  Fig.15f

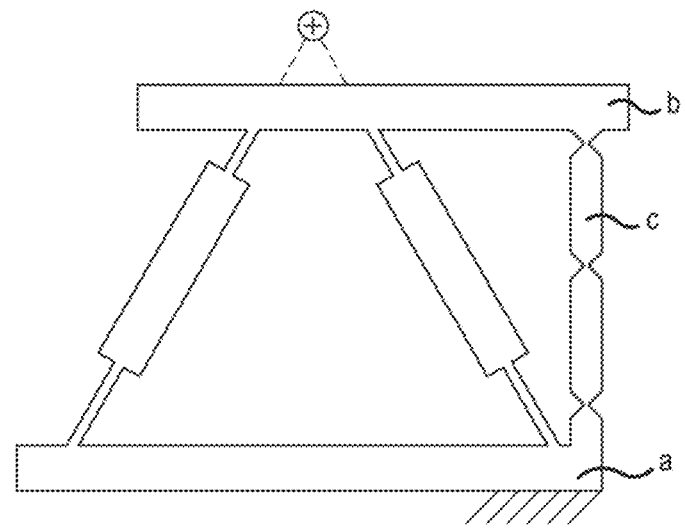
Fig.38
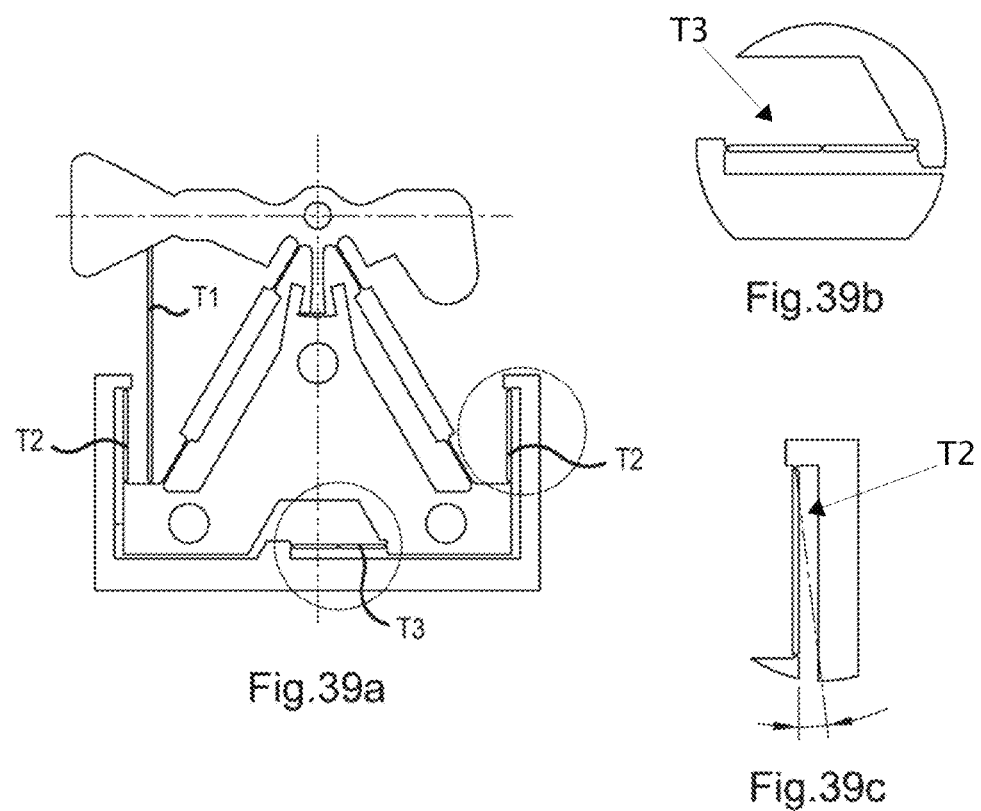
Fig.39a
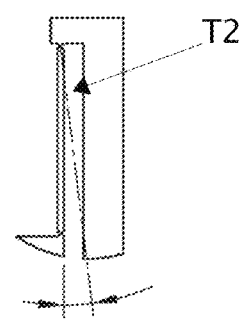
Fig.39b
Fig.39c

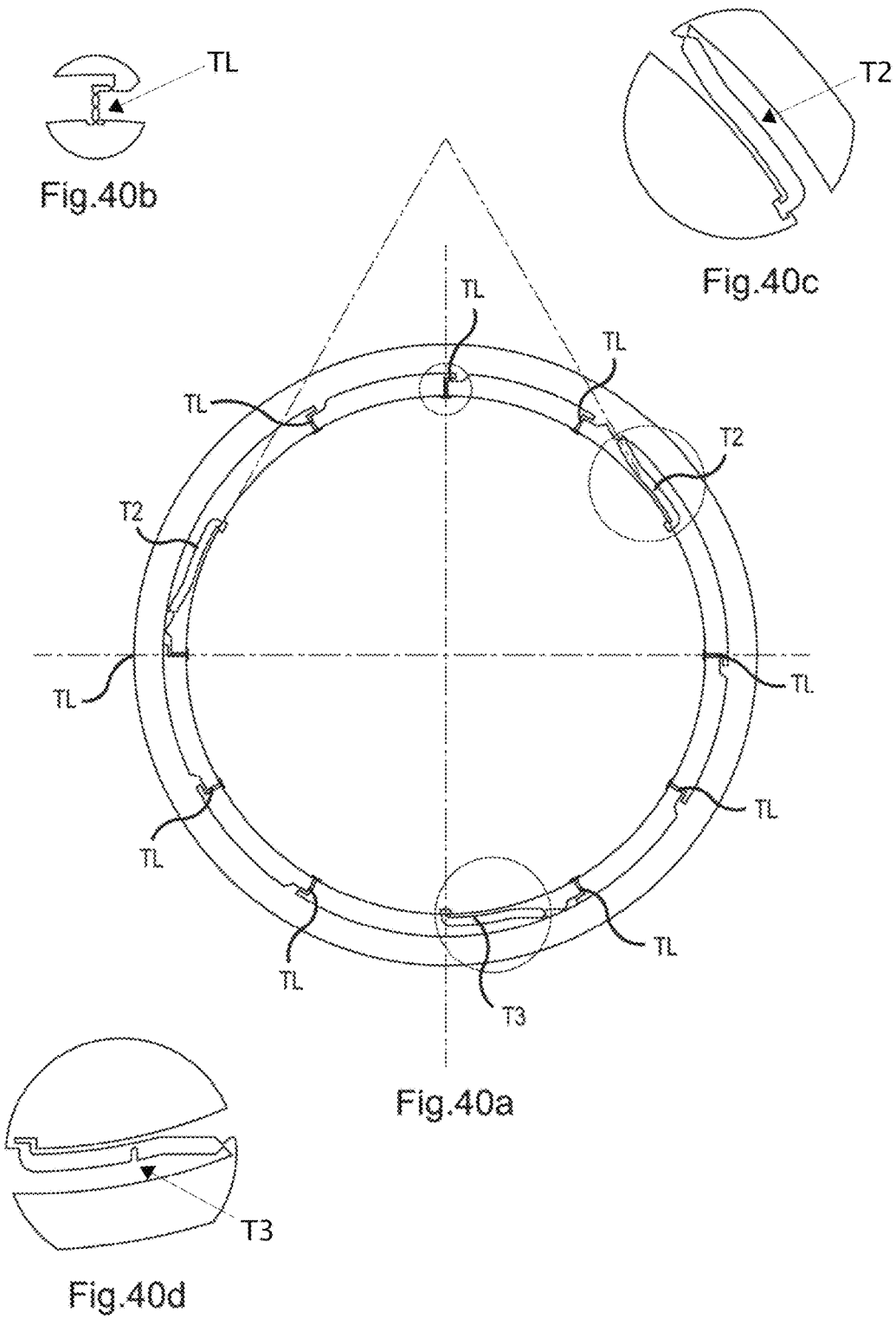

METHOD FOR FREEING A MICROMECHANICAL PART AND A MICROMECHANICAL PART COMPRISING SACRIFICIAL FASTENERS

TECHNICAL FIELD

The present invention relates to the field of micromechanics. It more particularly relates to a method for manufacturing a micromechanical part. It is particularly applicable in the field of machining parts by deep etching, in particular fragile parts, made from silicon, glass or metal alloys. It also applies to other machining processes such as: laser machining, water jet machining, electro-erosion machining, LIGA machining, chemical machining of glass, etc.

The invention also relates to a part that may be obtained using this method.

BACKGROUND OF THE INVENTION

Currently, as shown in FIG. 0, during machining of a part b from a substrate c of the wafer type, the part is made while preserving small bridges a of material that connect the part b to the substrate c. These bridges a form weak points that are next broken with a tool d that biases them in flexion or shearing. This method causes significant stresses in the part during breaking of the bridges. Furthermore, the energy required to break the bridges is substantial, and its sudden release at the time of the break sometimes causes damage on the fragile zones of the part, sometimes even at a significant distance from the bridge itself (transmission of the shock wave through the part or wafer). Yet some parts may sometimes include flexible pivots that are as weak as the bridges and that can be broken by the energy released during the breaking of the bridges.

To avoid these problems, the parts have sometimes been broken using laser cutting of the bridges. This approach is complex and expensive and leaves bridge stubs, the appearance of which is generally not well received.

Furthermore, the deformations undergone by the substrate or the part being manufactured or assembled also generate stresses on the part, which sometimes cause damage or breakage.

The present invention aims to resolve these problems simply, effectively and economically.

BRIEF DESCRIPTION OF THE INVENTION

More specifically, the invention relates to a method for manufacturing a micromechanical part from a substrate in which the part is manufactured by forming a plurality of fasteners between the part and the substrate, said fasteners being sacrificial. The fasteners comprise at least one hinge at the end of each fastener situated on the part side. The method comprises a step for breaking the sacrificial fasteners.

The invention also pertains to a part comprising a frame and a portion that is hinged relative to the frame, at least one guiding between the portion and the frame with at least one degree of freedom and at least one sacrificial connection between the hinged portion and the frame in the form of a released bolt capable of occupying two states, a singular state that makes it possible to block at least one degree of freedom of the articulated portion and a second state that makes it possible to set said portion in motion according to the degree of freedom of the guiding blocked in the singular state, until sacrificial connection is broken, the movement caused by the unlocking being tolerated by the guiding.

BRIEF DESCRIPTION OF THE DRAWINGS

Other details of the invention will appear more clearly upon reading the following description, done in reference to the appended drawing, in which:

FIG. 0, already mentioned, relates to the state of the art,
FIGS. 1 to 17 propose different illustrations of fastener types that can be used to connect a part to its wafer,
FIGS. 18 to 41 show example applications of the invention.

DETAILED DESCRIPTION OF THE INVENTION

One of the basic principles of the invention is to connect a part machined from a substrate using sacrificial fasteners which, particularly advantageously, comprise at least one hinge at one of their ends situated between the fastener and the part. It is advantageously possible to provide a second hinge at the end situated between the fastener and the substrate. By suitably combining the different types of connection that will be described below, it is possible to control the degrees of freedom of the part relative to the substrate, and thus to allow the movements of the part in certain directions, so as to limit the stresses experienced by the part, while maintaining it rigidly in other directions.

Neck Profiles

The hinges of the fasteners are made by thin areas formed in beams or blades that form the fasteners. Typically, the thin area is approximately 10 times weaker than the fastener. It has a sectional size approximately 10 times smaller than that of the fastener, and a longitudinal size smaller than $\frac{1}{10}^{th}$ the length of the fastener. If the thin area only pertains to one dimension of the section of the beam, the neck is said to be 2D (FIG. 1), since it can be manufactured using a two-dimensional machining process. If the thin area pertains to both dimensions of the section of the beam, the neck is said to be 3D (FIG. 1b), since it requires machining in three dimensions.

Figure 16:
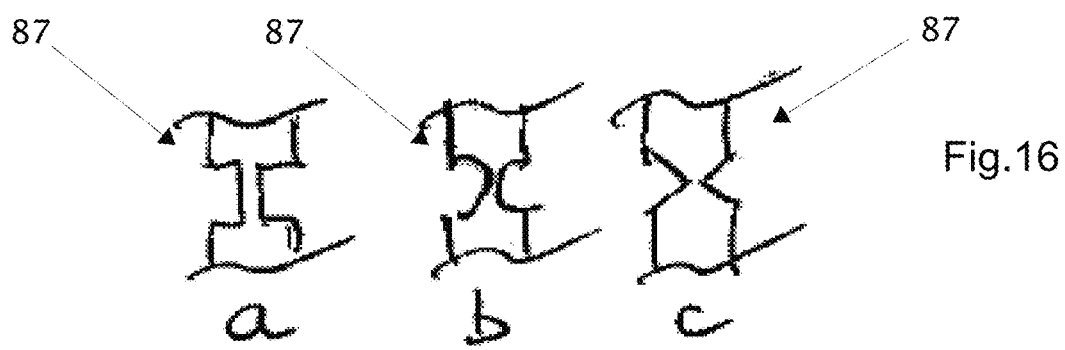
Figure 17:
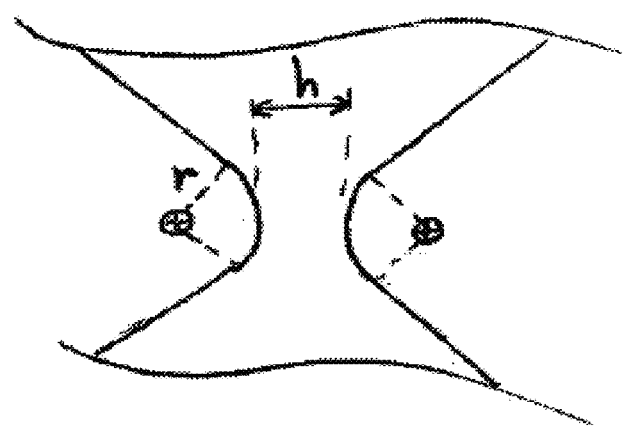

Different neck profiles 87 can be used (FIG. 16) to form the hinges. The most common are the prismatic neck (a), the circular neck (b) and the notched neck (c). Here we have shown 2D necks, but these illustrations may be transposed to 3D necks. The notched neck shown enlarged in FIG. 17 is particularly suitable for the present invention, since it makes it possible to concentrate the stresses in a very reduced material volume when the neck is biased in simple flexion. Thus, if one wishes to obtain a break, that break occurs with a reduced release of elastic energy. The stress concentration effect can be accentuated by reducing the radius r at the bottom of the notch to make it substantially smaller than the thickness h of the residual bridge.

Different Connection Types

Eleven different connection chains can be used in the context of this invention.

1. The "simple connecting rod" (FIG. 2) is made up of two flexible necks (1) and (3) and a rigid segment (2). In a planar analysis, its kinematic function is identical to a simple connecting rod hinged by two pivots (FIG. 3).
2. The "connecting rod with an intermediate hinge" (FIG. 4) is identical to the simple connecting rod, but further includes a third flexible neck (3) situated approximately at the middle of the rigid segment. In a planar analysis, its kinematic function is identical to a simple knee joint (FIG. 5).

Figure 6:
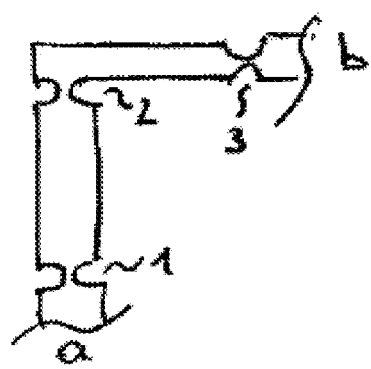
Figure 7:
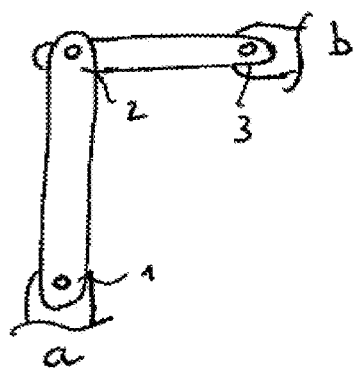

3. The "L shaped simple connecting rod" (FIG. 6) is made up of three flexible necks (1, 2 and 3) connecting two approximately perpendicular rigid segments. In a planar analysis, its kinematic function is identical to the chain (FIG. 7).

Figure 8:
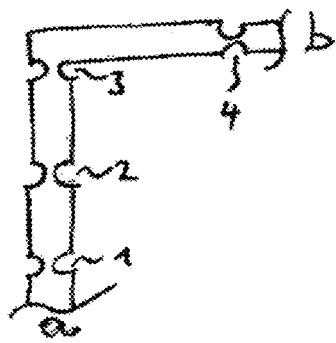
Figure 9:
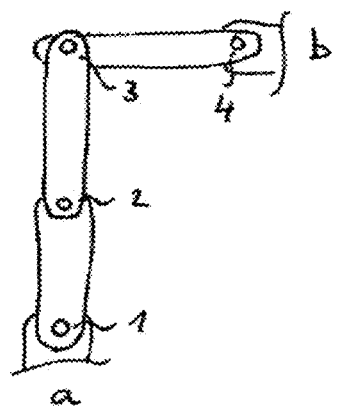

4. The "L shaped simple rod with an intermediate hinge" (FIG. 8) is identical to the symbol L, but further includes an additional neck (2) forming a knee joint. In a planar analysis, its kinematic function is identical to a chain (FIG. 9).

5. It is also possible to use connections of the spatial rod type (FIG. 2b), i.e., a rod equipped with a ball joint at each of the ends, which frees the part in all of its degrees of freedom, except traction-compression.

6. The spatial connecting rod with intermediate hinge 101, like the spatial rod, includes a ball joint at each of its ends. It also includes an intermediate hinge, which may be a spatial intermediate hinge (FIG. 4b), defined by a 3D neck, i.e., movable in all three dimensions, or a planar intermediate hinge (not shown), defined by a 2D neck, i.e., movable in two dimensions.

a. FIGS. 10a and 10b illustrate two alternatives of spatial connecting rod with intermediate hinge. In FIGS. $10a_1$ and $10a_2$, the ball joints are defined by the combination of two crossed 2D necks, i.e., oriented orthogonally. Between the two ball joints, a 2D neck forms the intermediate hinge. In FIGS. $10b_1$ and $10b_2$, there is an equivalent spatial rod 105, in which the ball joints are made by 3D necks and the intermediate hinge is shown with a different orientation. In both cases, a spatial rod is obtained only restricting one degree of freedom, i.e., the traction-compression direction.

It will be noted that the necks may be adapted by creating, as shown by FIG. 12, fragile zones 151, 155 making it possible to concentrate the stresses precisely and, if applicable, to obtain breaks of those necks, in clearly determined locations, as will be understood below. These fragile zones may be obtained by arranging one or more aligned openings in the flexion zones.

7. As the seventh type of connecting chain, FIG. 14a, 14b propose a torsion bar 161 including a torsion hinge combining at least two torsion-flexible structures. It is possible to obtain this type of structure using zones having a particular torsion profile, as illustrated in FIG. 15 (references 1-4), while having sections with thin walls that are not closed, therefore partially flexible in torsion. It is thus possible to have T-, Z-, L-, cross-shaped profiles that make it possible to obtain hinges blocking 5 degrees of freedom (only torsion is free). A V-shaped profile also works in this way.

It is also possible to have torsion bars using simple connecting rods (references 5, 6), horizontal or vertical, which block 3 degrees of freedom. Two of these rods may be placed in series so as, based on their respective arrangements, to obtain hinges blocking 3, 4 or 5 degrees of freedom. Thus, it is for example possible to implement two simple connecting rods arranged perpendicular to one another, so as to form an L, T or V.

This type of fastener is particularly suitable for applications in which little surface area of the substrate is available, for which a break of the fastener by torsion is ideal. It is also possible to position two links in series, the axes of which coincide. This makes it possible to obtain a hinge blocking 3 degrees of freedom. By combining these two alternatives, a hinge blocking 4 degrees of freedom is obtained.

The part may be provided with an actuating portion, off-centered relative to the axis of the hinge and making it possible to bias it more easily in torsion. This portion may be a beam, provided with a hole with which a tool can cooperate.

8 and 9. It is also possible to connect the part to the substrate directly using a 2D neck 205, 207 (FIGS. 11a and 11b) or a 3D neck 209 (FIG. 11c), as defined above.

10. It is possible to produce a 2D blade with 3 necks as proposed in FIG. 13b, which makes it possible to block or release out-of-plane degrees of freedom. In this example, we have three 2D necks, which makes it possible to obtain a hinge blocking three degrees of freedom, like a simple blade.

11. It is also possible to produce a 3D blade 232 with 3 necks as proposed in FIGS. 13a, 13b. In this example, there are two 2D necks and one 3D neck, positioned between the two 2D necks. A fastener 234, as shown in FIG. 13c, d is thus obtained blocking two degrees of freedom, like a simple blade provided with a notch in the middle thereof.

The fasteners of type 10 and 11 may include means for pushing the central hinged zone along the axis Z, until it breaks, in particular for applications described later. Fragile zones as proposed in FIG. 12 can also be added in the central neck of the fastener.

Thus, by having fasteners chosen from among the different possible connections proposed above, one skilled in the art can release or restrain a given degree of freedom, based on the mobility that one wishes to impart to the part in reference to its substrate, during its manufacture and relative to its application. The part may be blocked rigidly on the substrate, or it is for example possible to release flexion in either direction.

Simplified Illustration

Figure 18:
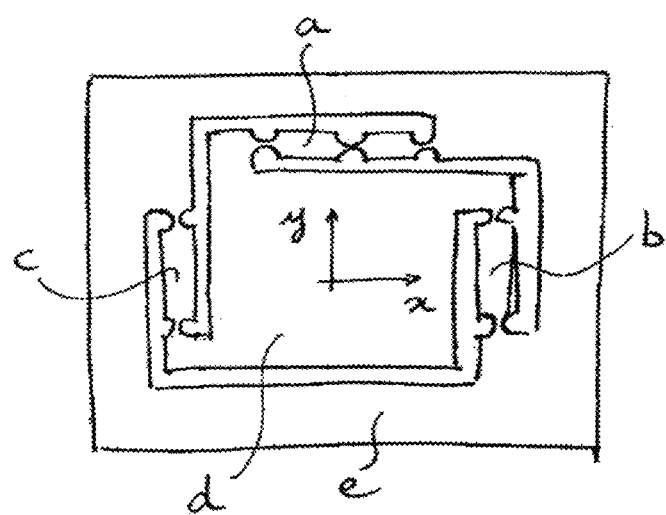

For simplification reasons, FIGS. 20 to 37 use a conventional illustration. As an example, the structure of FIG. 18 is shown in a simplified manner in FIG. 19: the substrate is symbolized by Earth connections (crosshatching a, b and c) at the base of the necks.

Principle of the Basic Connection

As will be described below, a first aspect of the invention lies in the use of the connections described above to connect a part to the substrate in which it has been machined. The connections formed between the part and its substrate must be broken so as to release the part to allow it to be used. Thus, the connections are used in a sacrificial manner. Advantageously, the connections are used in order to control the energy produced during the release of the part and avoid, or at least limit, the risks of breaking of the part.

Figure 20:
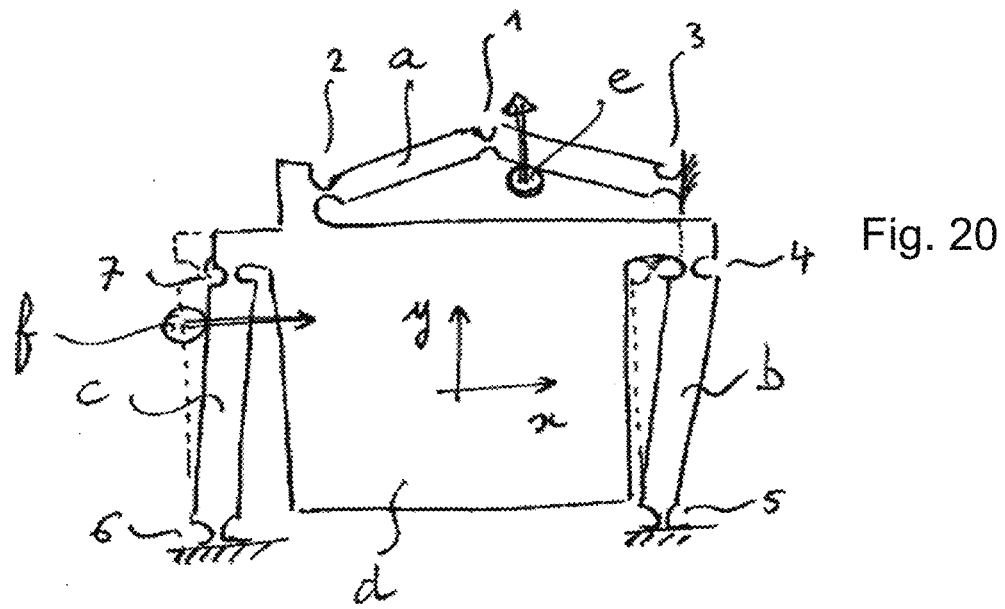

FIG. 20 shows a typical example of a connection by a rod between a part (d) and a wafer (e) in which the part has been machined. The part (d) is rigidly fastened to its wafer (e) by two simple connecting rods (b) and (c) and a connecting rod with an intermediate hinge (a). In this arrangement, with only these, the two simple connecting rods give the part a single degree of freedom that corresponds to translation along the axis x (for movements of infinitesimal amplitude). The connecting rod with an intermediate hinge blocks that single degree of freedom, which limits the possibility of any relative movement of the part with respect to the wafer.

Figure 21:
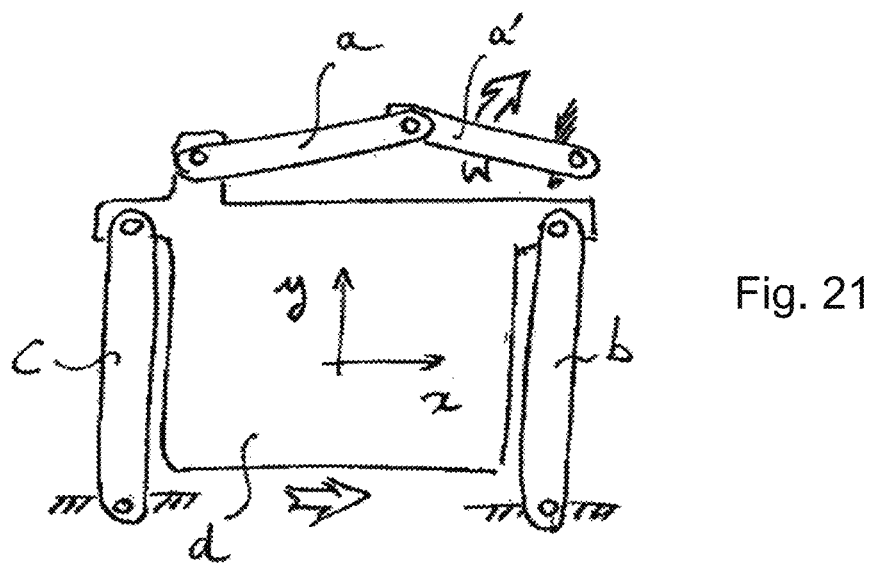
Figure 22:
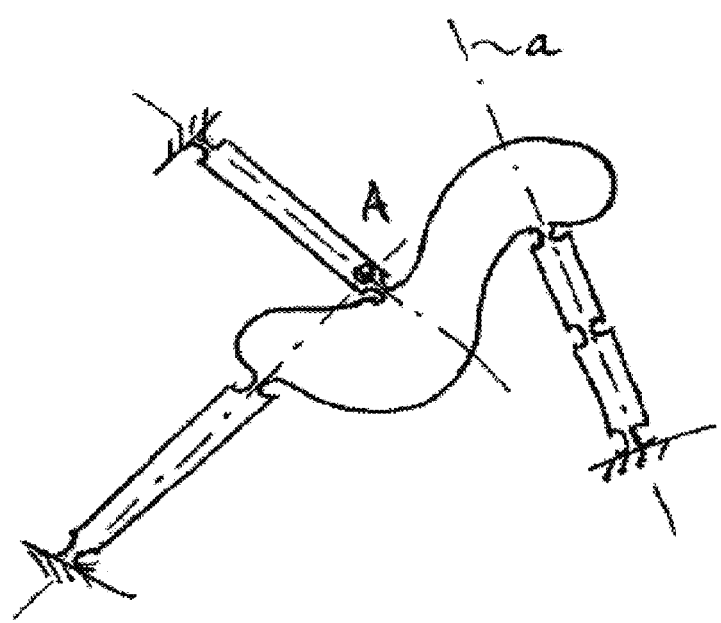

To release the part (FIG. 20), a tool (e) is used to bend the intermediate hinge according to its natural degree of freedom until the three necks (1, 2 and 3) break. During bending of the intermediate hinge, a second order movement (shortening of the link) causes a translational movement of the part along the axis x (d). This degree of freedom being natural for the simple connecting rods (b) and (c), it does not cause forces or significant stresses in the part itself. This kinematic phenomenon is also illustrated in FIG. 21.

Once the connecting rod with an intermediate hinge has been removed, a tool (f) (FIG. 20) is used to bend one of the two simple connecting rods according to its natural movement until its next break (it is also possible to act directly on the part with the tool and to move it according to its natural degree of freedom). Lastly, the necks of the last link can be broken (if they were not broken at the same time as those of the second). The break caused by the movement according to the natural degree of freedom occurs without excessive dissipation of energy in the part.

Kinematic Conditions for Proper Operation

Figure 23:
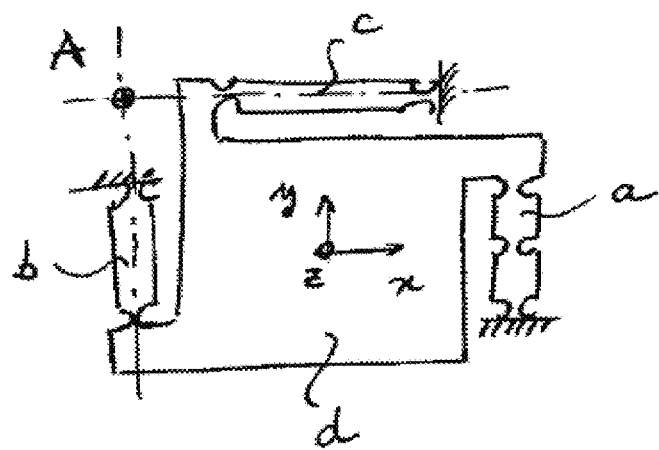
Figure 24:
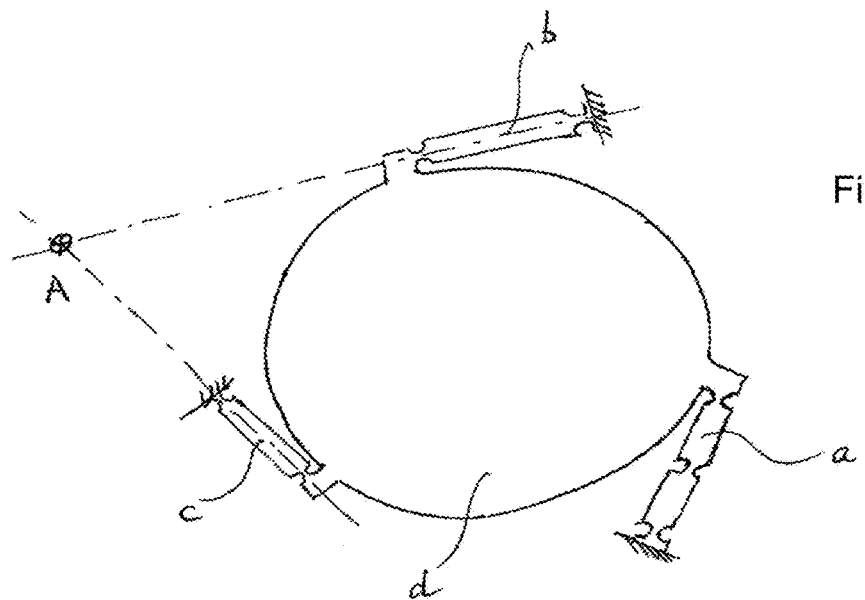

For the connection principle to work (FIG. 22), it suffices for the axis (a) of the connecting rod with an intermediate hinge not to pass through the cooperation point (A) of the two axes of the other two rods. FIGS. 23 and 24 show two typical examples.

Figure 25:
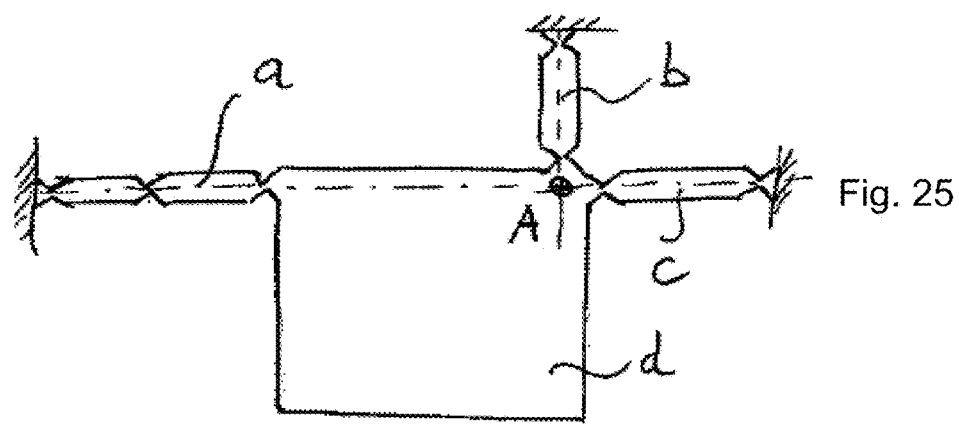
Figure 26:
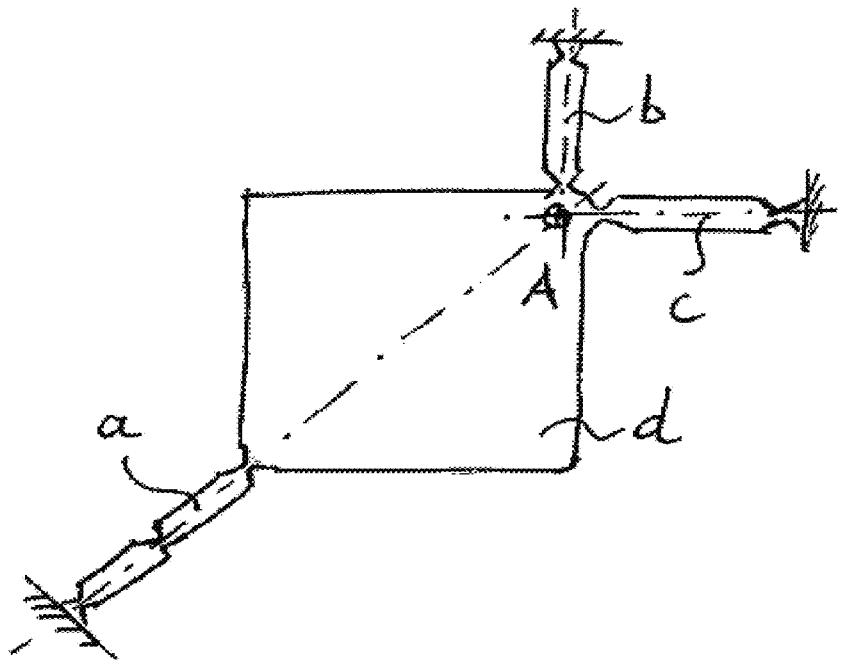

As an example, FIGS. 25 and 26 propose two arrangements that do not respect this condition and lead to two problems.

The connection of the part to the wafer is not rigid, because for small amplitude movements, one degree of freedom remains: this involves pivoting of the part around the cooperation point (A) between the three axes of the three links.

During the release operation, the bending of the connecting rod with an intermediate hinge produces a second order movement (shortening of the link) that is blocked by the other two rods. This causes significant forces to pass through the part itself (and by reaction, through the wafer). Thus, breaking risks of the part or wafer occur.

Figure 27:
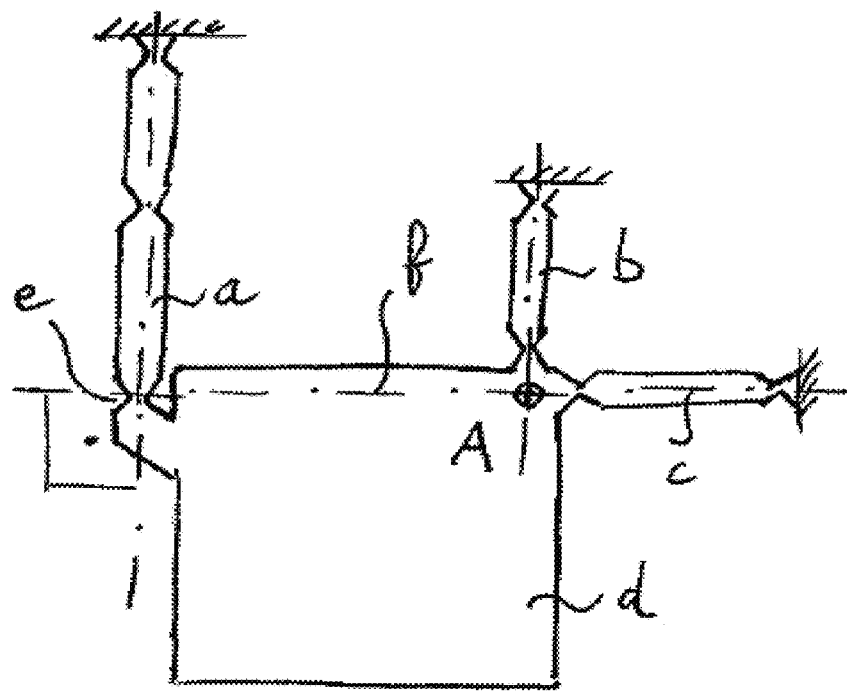
Figure 28:
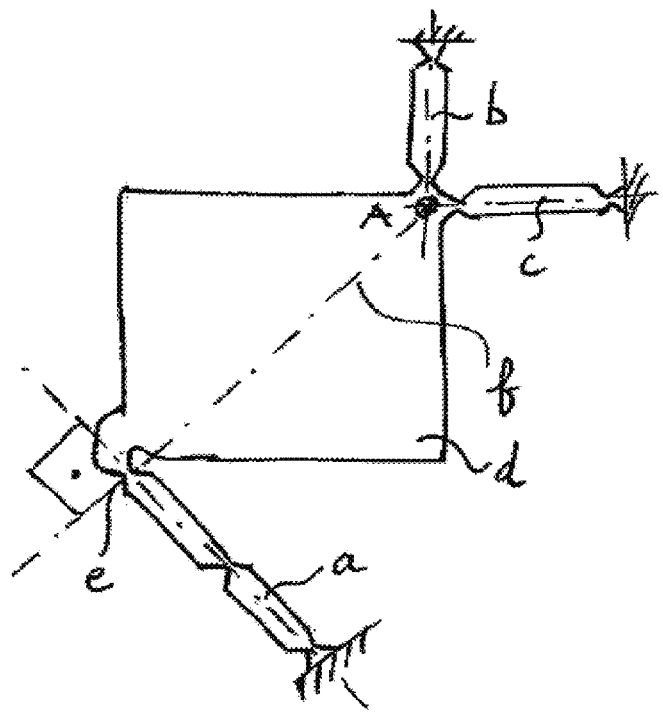

The arrangements that produce the greatest rigidity in the plane, two advantageous examples of which are proposed in FIGS. 27 and 28, are those where the axis (a) of the connecting rod with an intermediate hinge is perpendicular to the line (f) connecting the cooperation point (A) of the axes of the two simple connecting rods to the first neck (e) of the connecting rod with an intermediate hinge.

Figure 19:
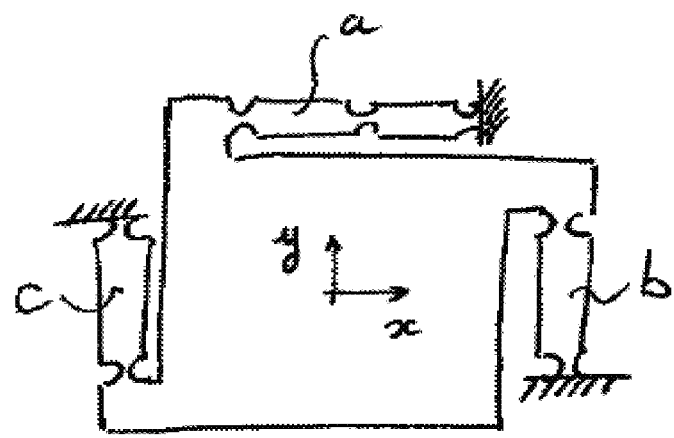
Figure 29:
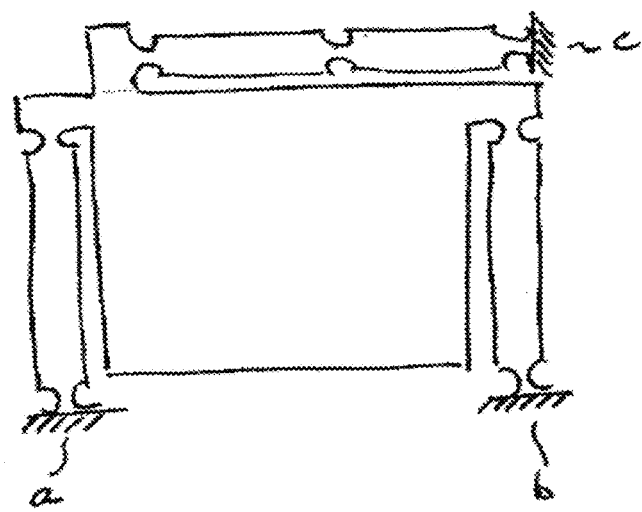

In the cases where the two simple connecting rods are parallel, the arrangements that produce the greatest rigidity in the plane are those where the connecting rod with an intermediate hinge is perpendicular to the other two rods. FIGS. 19 and 29 show two examples of this.

Kinematic Analysis

Figure 30:
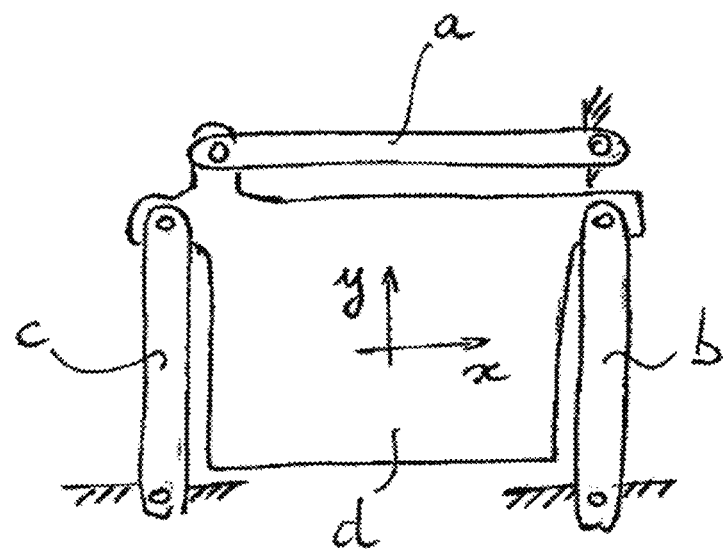
Figure 31:
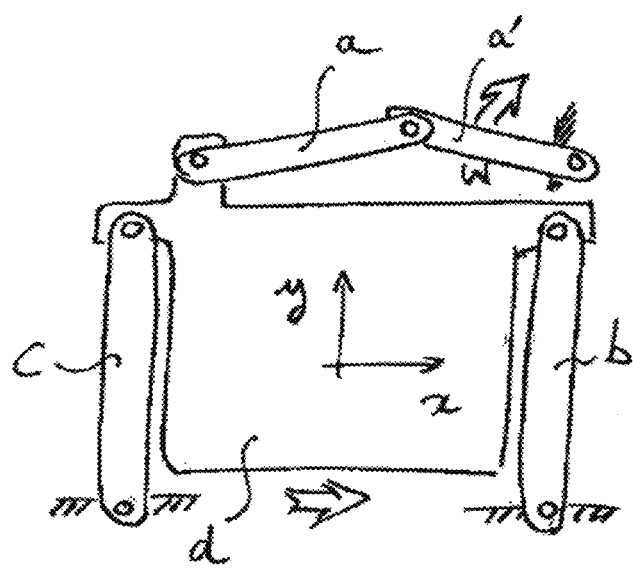

In a planar kinematic analysis, the connection principle is based on the structure of FIG. 30. This kinematic structure includes 6 pivots and 2 closed kinematic loops. According to the Grübler method for calculating mobility, this corresponds to a connection with zero mobility 6−2×3=0. This corresponds to a blocked, isostatic connection. Thus, this connection has the interesting property that small dimensional variations of the part, links or wafer (under the effect of heat expansion or internal or external stresses, for example) do not cause strong forces or stresses in the part, reducing the risks of untimely break.

The insertion of a neck designed to form a unlocking mechanism on one of the links (FIG. 31) adds mobility to the structure: 7−2×3=1. "Unlocking mechanism" refers to a fastener that could occupy a singular state in which one degree of freedom is blocked, which results in locking of the part, and a second state in which that degree of freedom is unblocked, which makes it possible to restore movement to the part, i.e., to unlock it. An excitation in this degree of freedom will allow various fasteners to break. Thus, in its generic configuration, this kinematic arrangement does not constitute a blocked connection between the part and the wafer. Nevertheless, the particular configuration used in the context of the present invention is a singular configuration of this kinematic structure where the 3 necks of the rod with intermediate hinge are aligned. In such a configuration, a rod with intermediate hinge is equivalent to a simple connecting rod. Thus, this singularity of the kinematics causes the degree of mobility of the rod with intermediate hinge to disappear, and the connection between the part and the wafer behaves in the same way as the arrangement of FIG. 30: the part is rigidly fastened to the substrate.

In its physical implementation (for example, a monolithic cutout in a wafer), the stability of the rod with intermediate hinge around its alignment singularity is guaranteed by the elastic return torques of the three necks making it up. In fact, these three necks are machined in their neutral state (i.e., without elastic bias), in the aligned positioning. The minimum elastic energy therefore corresponds to the alignment configuration. Thus, below a certain critical compression load of the knee joint, the latter remains axially rigid. If a compression load exceeding that critical load occurs, then the elastic equilibrium of the knee joint initially aligned breaks and the structure buckles. It is preferable to avoid buckling of the rod with intermediate hinge throughout the entire manufacturing process. If it is provided that strong forces bias the part during certain production steps (for example, during polishing phases), then the rigidity of the necks of the rod with intermediate hinge must be chosen to be high enough to guarantee that the critical buckling load is greater than the maximum compression loads expected on the knee joint.

Supernumerary Fasteners

Figure 32:
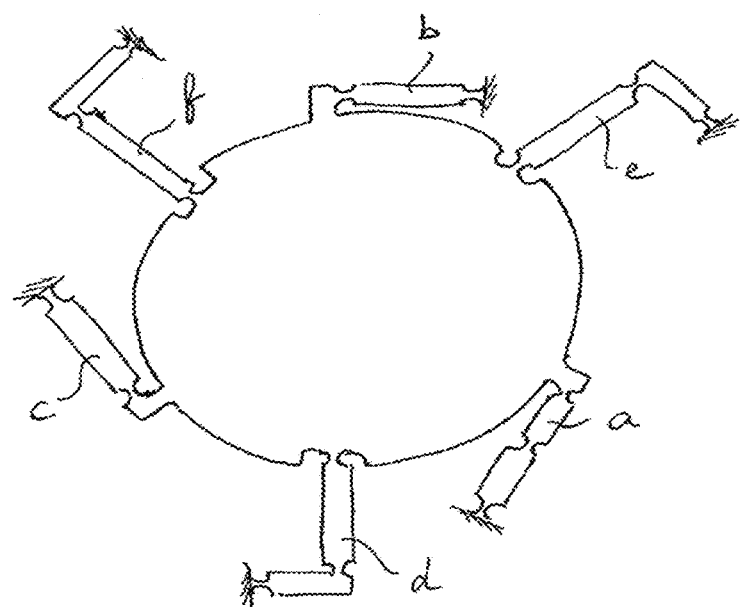
Figure 33:
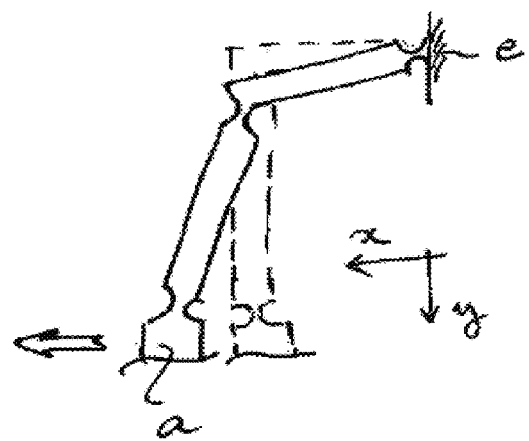

In the case of parts that are strongly mechanically biased in the out-of-plane direction during machining (for example, during polishing, drilling or milling steps), it may prove necessary to use more than three connecting chains to fasten the part to the wafer. The present invention proposes the use of "L shaped simple connecting rod" connecting chains. The latter provide a connection that is only rigid in the out-of-plane direction and therefore does not interfere with the planar kinematic functions of the 3 base links. These chains, called supernumerary (i.e., not essential to the definition of the position of the part relative to the substrate and imparting the hyperstatic nature), increase the rigidity and mechanical strength in the out-of-plane direction. FIG. 32 for example shows how 3 "L shaped simple connecting rods" can be used in addition to the 3 base rods (see FIG. 24). To release such a fastening system, it is necessary to start by breaking the unlocking mechanism (a), then the rods (b and c). Lastly, the part itself is moved into the plane until the "L shaped simple connecting rods" next break. FIG. 33 shows how the "L shaped simple connecting rods" deform when the part (a) is moved, for example along the axis x (any other direction of movement in the plane is also valid).

Figure 34:
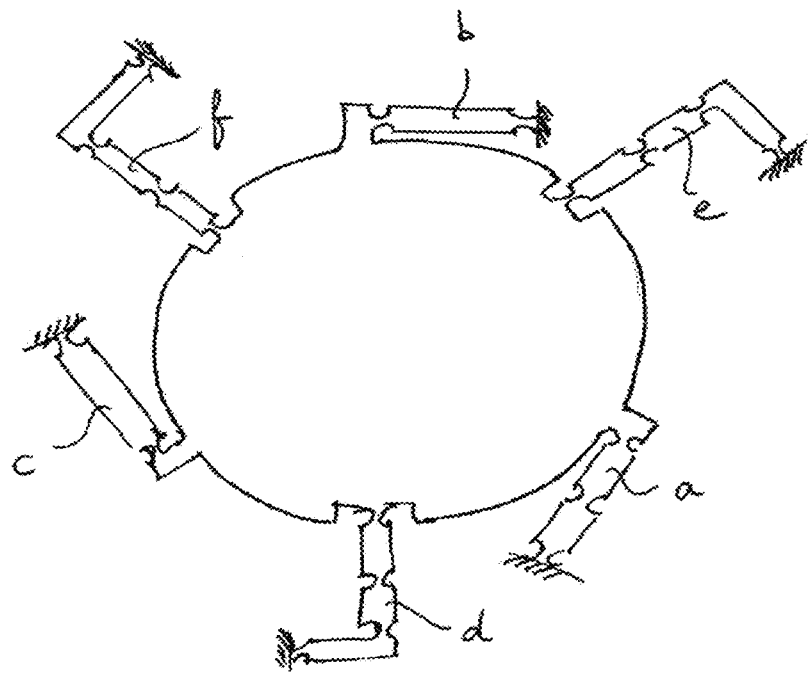
Figure 35:
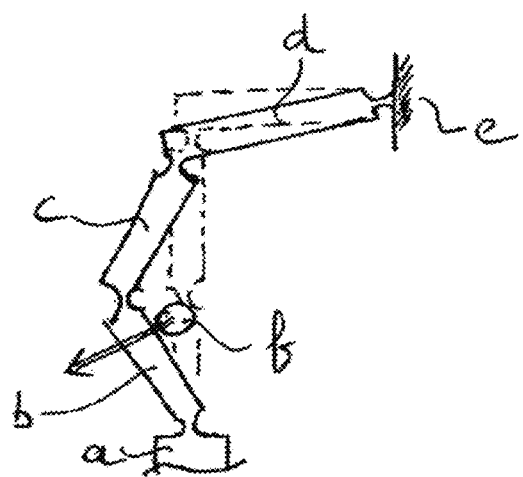

The "L shaped simple connecting rods" can be replaced by "L shaped simple rods with an intermediate hinge" (FIG. 34). As in the case of connecting rods with an intermediate hinge, the alignment singularity allows them to play the same kinematic role as the "L shaped simple connecting rods". These "L shaped simple rods with an intermediate hinge" further have the advantage (FIG. 35) that they can be broken individually (manually or in an automated manner) without requiring movement of the part (a) itself. Thus, the strict sequence described, required when "L shaped simple connecting rods" are used (see paragraph above), no longer needs to be respected. It is possible to release the Ls or the rods first, indifferently. This reduces the risks of handling errors.

Embedded Necks

Figure 36A:
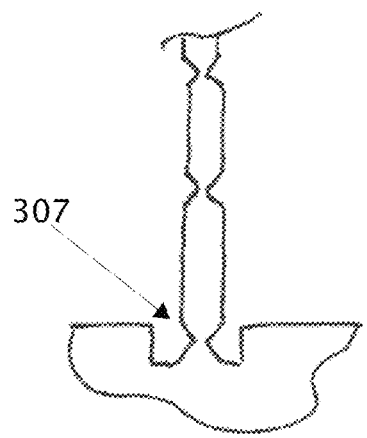
Figure 36B:
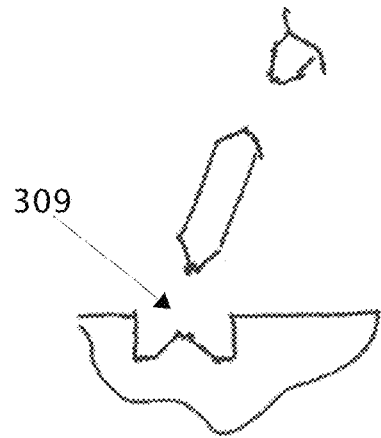

Irrespective of the type of connecting chain used, there is always a neck 307 that is fastened to the part itself. After release, half of that neck remains on the part. The presence of that small protuberance may, in some cases, hinder the proper operation of the part. One solution to partially offset this drawback consists of embedding that neck, i.e., placing it withdrawn from the surface of the part (FIG. 36*a*). Thus, after release, the thus broken neck 309 (FIG. 36*b*) leaves no protuberance protruding from the surface.

Use of Connecting Rods with an Intermediate Hinge to Block Flexible Guides

Sometimes, the machined part includes, monolithically, a portion designed to be hinged on a frame using a guide, for example a flexible guide, and the frame. The fasteners as proposed in the present invention, in particular the connecting rods with an intermediate hinge, can also be used to block the movement of the hinged portion relative to the frame, typically for manufacturing or assembly. Thus, there is at least one sacrificial connection between the hinged portion and the frame in the form of an unlocking mechanism capable of occupying two states: a singular state that makes it possible to block at least one degree of freedom of the guide, and a second state that makes it possible to set said portion in motion according to one degree of freedom of the guide blocked in the singular state, until the sacrificial connection breaks, the movement induced by the unlocking corresponding to one of the degrees of freedom of the guide. The latter thus tolerates that movement, without significant forces or stresses appearing in the part, i.e., capable of damaging it.

Figure 37:
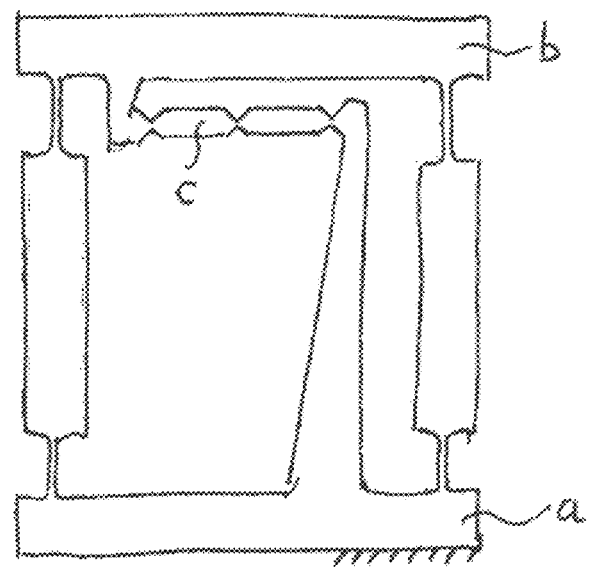

FIG. 37 shows the typical example of a table with 4 flexible necks. This type of part must be immobilized during machining phases to avoid any untimely movement of the moving platform (b). This can advantageously be done using a connecting rod with an intermediate hinge (c) connecting the platform to the base (a). This base (a) will in turn be fastened to the wafer using three links (not shown in this figure). FIG. 38 shows the typical example of a pivot with a remote compliance center (RCC), the rotation of which is blocked by a connecting rod with an intermediate hinge.

Examples

FIG. 39*a* shows the plane of an RCC pivot to scale (which does not make it possible to clearly distinguish the necks), the rotation of which is blocked by a connecting rod with an intermediate hinge T1 and the base of which is fastened to the wafer by two simple connecting rods T2 and one second connecting rod with an intermediate hinge T3. An enlarged detail of T3 (circled portion in FIG. 39*a*) is shown in FIG. 39*b*, and an enlarged detail of T2 (circled portion in FIG. 39*a*) is showing in FIG. 39*c*. These parts have been sized to be machined in a monocrystalline silicon wafer (typically 350 microns thick) by deep etching (DRIE). The first connecting rod with an intermediate hinge T1 makes it possible to keep the lever pivoted by the RCC pivot during the assembly of the part. Once the part is assembled in its mechanism, the connecting rod with an intermediate hinge T1 can be broken according to its natural degree of freedom to release the RCC pivot.

FIGS. 40*a-d* show a disc that must go through polishing steps during its manufacturing process. This disc is attached to the wafer (500 microns thick) by two simple connecting rods T2, one connecting rod with an intermediate hinge T3 and nine "L shaped simple rods with an intermediate hinge" TL. An enlarged detail of TL (circled portion in FIG. 40*a*) is shown in FIG. 40*b*, and enlarged detail of T2 (circled portion in FIG. 40*a*) is shown in FIG. 40*c* and an enlarged detail of T3 (circled portion in FIG. 40*a*) is shown in FIG. 40*d*. All of the necks are embedded withdrawn from the surface, at the periphery of the disc. The release of the disc first goes through the break of the nine L shaped simple rods with an intermediate hinge, according to the natural degree of freedom to reduce the stresses undergone by the part. Then, the case of FIG. 24 occurs, the connecting rod with an intermediate hinge is released, and lastly the two simple connecting rods T2 are released.

Lastly, whether for the connection of a part to its substrate or the maintenance of a portion that is hinged relative to its frame, a sacrificial fastener hinged at least at its end situated on the side of the micromechanical part is used to immobilize a micromechanical part temporarily. The sacrificial fastener is arranged so as to immobilize the micromechanical part, and it can be broken by actuation around the hinge.

Figure 41:
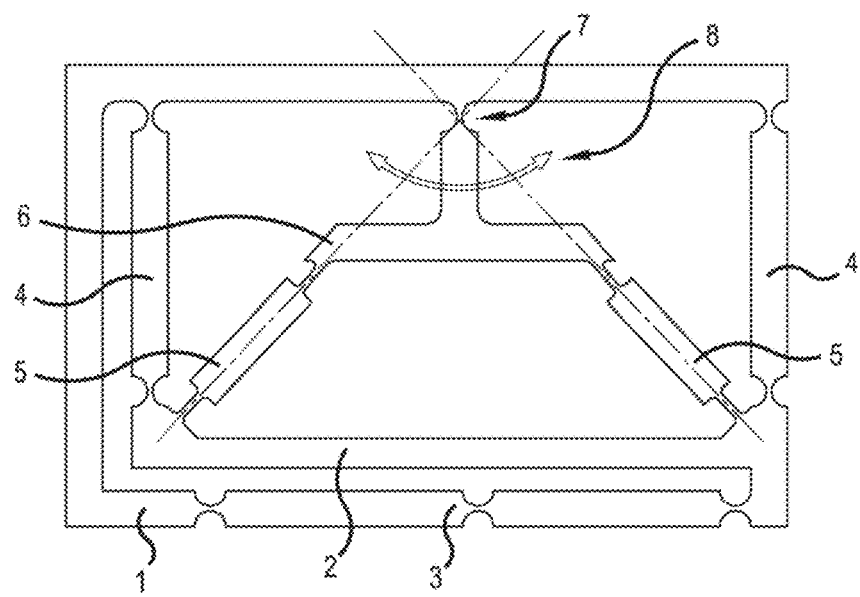

The hinged sacrificial fastener can be an unlocking mechanism capable of occupying two states: a singular state that corresponds to a limited kinematic state of the part, and a second state in which the part has at least one additional degree of freedom relative to the singular state, the movement of the part according to that additional degree of freedom being able to cause a break of the hinged sacrificial fastener. In the event the part is made up of a frame and a portion hinged on the frame, the sacrificial fastener can also be a 2D neck or a 3D neck located precisely on one of the axes of rotation of the hinged portion. The movement of the part according to that degree of freedom can cause the sacrificial fastener to break. For example, in FIG. 41, there is a hinged portion 6 that is hinged relative to a frame 2 by two links 5. The frame is connected to the substrate 1 by two sacrificial links 4 and by one sacrificial connecting rod with an intermediate hinge 3. The hinged portion 6 is also connected to the substrate by a sacrificial 2D neck 7 in order to immobilize the hinged portion during its assembly. The 2D neck can be broken by imparting a rotational movement around the axis of the neck, following arrow 8.

The present invention is particularly advantageously applicable to produce micromechanical parts by deep etching, with a base of silicon from a wafer, but it can also be implemented for parts made with a base of glass or metal alloys, from a substrate. Depending on the considered material, it is possible to machine the part by laser machining, water jet machining, electro-erosion machining, LIGA machining, chemical machining of glass, etc. Relative to simple fasteners, formed from simple beams, the hinged fasteners according to the invention make it possible to functionalize the connection between the part and its substrate to give it a rigidity or freedom in the desired degrees of freedom based on a given application, and further making it possible to control the release of energy in the substrate and the part during breaking of the fasteners. A considerable decrease has been observed in the number of parts damaged or broken during manufacturing or during release from their substrate.

It will also be noted that the various examples proposed above may be oriented indifferently relative to the substrate, including by rotation of the fasteners around themselves, around their axes, in reference to the substrate.

The invention claimed is:

1. A method for manufacturing a micromechanical part from a substrate in which the micromechanical part is manufactured by forming a plurality of fasteners between the micromechanical part and the substrate, said fasteners being sacrificial, the method comprising:

a step for breaking the sacrificial fasteners, said sacrificial fasteners comprising at least one hinge at an end of each sacrificial fastener situated on a side of the micromechanical part, wherein one of the sacrificial fasteners includes at least one unlocking mechanism, which is provided with at least one fragile zone configured to break and is capable of occupying two states as follows:

a first state that corresponds to a limited kinematic state of the micromechanical part where at least one degree of freedom is blocked with respect to the substrate, and a second state, in which the at least one degree of freedom that is blocked in the first state is released, said breaking comprising a movement of the micromechanical part according to the at least one degree of freedom of the unlocking mechanism, causing the sacrificial fastener, including said unlocking mechanism, to break.

2. The method according to claim 1, wherein an end of said sacrificial fasteners comprise a second hinge situated on a side of the substrate.

3. The method according to claim 2, wherein said sacrificial fasteners are chosen from among a simple connecting rod, a connecting rod with an intermediate hinge, a L shaped simple connecting rod, a L shaped simple rod with an intermediate hinge, a spatial rod, a spatial rod with an intermediate hinge, a torsion bar, a 2D neck and 3D neck, a 2D blade with three necks and a 3D blade with three necks.

4. The method according to claim 2, wherein said unlocking mechanism is provided with at least one fragile zone configured to break.

5. The method according to claim 1, wherein said sacrificial fasteners are chosen from among a simple connecting rod, a connecting rod with an intermediate hinge, a L shaped simple connecting rod, a L shaped simple rod with an intermediate hinge, a spatial rod, a spatial rod with an intermediate hinge, a torsion bar, a 2D neck and 3D neck, a 2D blade with three necks and a 3D blade with three necks.

6. The method according to claim 5, wherein said unlocking mechanism is provided with at least one fragile zone configured to break.

7. The method according to claim 1, wherein the plurality of sacrificial fasteners forms an isostatic connection with zero degrees of freedom in the plane between the micromechanical part and the substrate, said isostatic connection includes at least three flexible links with non-concurrent axes, at least one of which is a flexible connecting rod with an intermediate hinge serving as the unlocking mechanism.

8. The method according to claim 7, wherein the remaining two flexible links of the at least three flexible links are simple connecting rods.

9. The method according to claim 7, wherein an axis of the connecting rod with an intermediate hinge is perpendicular to a line connecting the cooperation point of the axes of the two simple connecting rods to the first neck of the connecting rod with the intermediate hinge.

10. The method according to claim 7, wherein the two simple connecting rods are parallel and in that the connecting rod with the intermediate hinge is perpendicular to the two simple connecting rods.

11. The method according to claim 1, wherein said sacrificial fasteners are connected to the micromechanical part by a neck withdrawn from a periphery of said micromechanical part.

12. The method according to claim 1, wherein the micromechanical part is further connected to the substrate by rigid supernumerary fasteners only in an out-of-plane direction.

13. The method according to claim 1, wherein the substrate, the micromechanical part, and the sacrificial fasteners are made of silicon, metal alloys or glass.

* * * * *